(12) United States Patent
Hewitt et al.

(10) Patent No.: US 9,686,884 B2
(45) Date of Patent: Jun. 20, 2017

(54) SAFETY MECHANISM FOR AN ELECTRICAL EQUIPMENT RACK

(71) Applicant: International Business Machines Corporation, Armonk, NY (US)

(72) Inventors: James Hewitt, Eastleigh (GB); Colin I. Holyoake, Braishfield (GB); Richard Postlethwaite, Salisbury (GB); Caroline J. Thomas, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/929,480

(22) Filed: Nov. 2, 2015

(65) Prior Publication Data

US 2017/0127548 A1    May 4, 2017

(51) Int. Cl.
    *H05K 7/14*    (2006.01)
    *H05K 7/18*    (2006.01)

(52) U.S. Cl.
    CPC ........... *H05K 7/1489* (2013.01); *H05K 7/183* (2013.01)

(58) Field of Classification Search
    CPC ...... H05K 7/1489; H05K 7/183; A47B 57/50; A47B 96/06; A47B 88/044; E05D 5/023; Y10T 403/7015
    USPC ......................................................... 211/26
    See application file for complete search history.

(56) References Cited

U.S. PATENT DOCUMENTS

| | | | | |
|---|---|---|---|---|
| 3,637,086 A | * | 1/1972 | Klein | ................... A47B 57/482 |
| | | | | 211/192 |
| 4,387,872 A | * | 6/1983 | Hogue | ................... A47B 57/42 |
| | | | | 248/220.43 |
| 4,700,916 A | * | 10/1987 | Bastian | ................... A47B 57/42 |
| | | | | 211/192 |
| 5,022,621 A | * | 6/1991 | Quest | .................... A47B 57/42 |
| | | | | 248/222.13 |

(Continued)

FOREIGN PATENT DOCUMENTS

| TW | 200944159 A | 11/2009 |
|---|---|---|
| TW | M372116 U | 1/2010 |

OTHER PUBLICATIONS

IBM Knowledge Center, "Understanding and installing the TS7620 Appliance Express hardware", TS7610 Deduplication Applicance Express 3.2.0, <http://www-01.ibm.com/support/knowledgecenter/api/content/nl/en-us/STQQ5B_3.2.0/com.ibm.storage.ts7610_3-2.cust.doc/ts7610isg_installing_the_hardware.html>, printed Sep. 21, 2015, pp. 1-12.

(Continued)

*Primary Examiner* — Korie H Chan
(74) *Attorney, Agent, or Firm* — Gilbert Harmon, Jr.

(57) ABSTRACT

A safety mechanism is provided for an electrical equipment rack. The rack has a frame with a vertical frame element including vertically spaced at intervals mounting points which are apertures for accepting mounting pegs of a frame mountable portion of an electrical equipment unit mounting rail. The safety mechanism has a vertical strip member mounted for vertical movement adjacent the vertical frame element, and the vertical strip member includes spaced apertures corresponding to the apertures on the vertical frame element. The vertical strip member is movable between a fully raised position and a lowered position. The safety mechanism further includes a raising mechanism for (Continued)

raising the vertical strip member from a lowered position to the fully raised position.

18 Claims, 9 Drawing Sheets

(56) References Cited

U.S. PATENT DOCUMENTS

| | | | | |
|---|---|---|---|---|
| 5,074,422 | A * | 12/1991 | Holtz | A47B 57/10 |
| | | | | 108/108 |
| 5,230,492 | A * | 7/1993 | Zwart | A47B 57/42 |
| | | | | 211/187 |
| 5,758,988 | A * | 6/1998 | Theodorou | F16B 5/0036 |
| | | | | 160/135 |
| 6,312,186 | B1 * | 11/2001 | Rock | A47B 57/50 |
| | | | | 211/182 |
| 7,204,371 | B2 * | 4/2007 | Woolsey | H05K 7/1489 |
| | | | | 211/26 |
| 8,235,475 | B2 | 8/2012 | Ludwig et al. | |
| 8,544,860 | B2 | 10/2013 | Fan | |
| 8,567,883 | B2 | 10/2013 | Hsiao | |
| 8,651,600 | B2 * | 2/2014 | Cheong | F25D 23/00 |
| | | | | 108/108 |
| 2011/0115354 | A1 | 5/2011 | Blochl et al. | |

OTHER PUBLICATIONS

Notohardjono et al., "Static and Dynamic Handling Stability of Server Rack Computers", ASME 2014 12th Biennial Conference on Engineering Systems Design and Analysis, vol. 3: Engineering Systems; Heat Transfer and Thermal Engineering; Materials and Tribology; Mechatronics; Robotics, Copenhagen, Denmark, Jul. 25-27, 2014, Conference Sponsors: International, ISBN: 978-0-7918-4585-1, Copyright © 2014 by ASME, pp. 1-3.

* cited by examiner

SAFETY MECHANISM FOR AN ELECTRICAL EQUIPMENT RACK

BACKGROUND

The present invention relates generally to computer hardware, and more particularly to electrical equipment racks.

Most datacenters are based around standard racking systems, each datacenter rack in the standard racking system contains a number of individually removable electrical equipment units, particularly data handling units, for example data storage units or server computer units. In one common configuration, a standard datacenter rack comprises a large skeletal metal frame defining a rectangular faced box comprising a horizontal rectangular base with an upright mounting element extending from each corner, and with a top completing the structure. The datacenter rack, or simply the rack, is designed for the horizontal insertion of a number of data handling units, for example server computer units, or servers, typically each server being of a standard size. Standard server-rack configurations are measured in server units, each server unit, or 1U, comprises a horizontal space measuring 19 inches (480 mm) wide by 1.75 inches (44 mm) high. A typical full size rack accommodates a 42U high collection of standard sized servers, for example up to 21 2U servers, and typically measure 73.5 inches (1.87 m) high internally. Other rack sizes include 36U and 47U.

Typically each server is mounted on an extendable horizontal mounting rail arrangement at either side of the rack. Each mounting rail comprises a horizontal fixed element which clips in to the front and back vertical members on one side of the rack, using one or more of provided spaced mounting apertures or holes in each vertical element. Each mounting rail further comprises a horizontal server support member extendable on roller bearings out of the front of the rack. When the server support members of two complementary mounting rails on either side of the rack are extended out of the front of the rack, a horizontally aligned server may be attached to each side server support member by way of, for example, complementary protruding and recessed fastening means. Once securely attached to each side server support member, the server may be pushed fully in to the rack by way of the roller bearings in the mounting rails. Once in its operational position, service cabling may be attached to the mounted server.

SUMMARY

Some embodiments of the invention provide a safety mechanism for an electrical equipment rack, and an electrical equipment rack including the safety mechanism. The rack has a frame with a vertical frame element. The vertical frame element has vertically spaced at intervals mounting points which are apertures for accepting mounting pegs of a frame mountable portion of an electrical equipment unit mounting rail. The safety mechanism includes a vertical strip member mounted for vertical movement adjacent the vertical frame element. The vertical strip member has apertures spaced at intervals corresponding to the intervals at which the vertically spaced mounting points are spaced on the vertical frame element. The vertical strip member is operable for moving between a fully raised position, in which the apertures of the strip member are aligned with the apertures of the vertical frame element so as to allow acceptance or removal of mounting pegs of a mounting rail, and a lowered position, in which the apertures of the vertical frame element are offset relative to the apertures of the vertical strip member, to obstruct the acceptance or removal of the mounting pegs. The safety mechanism also includes a raising mechanism for raising the vertical strip member from a lowered position to the fully raised position. The raising is accomplished by insertion of a fastener which upon insertion attaches a support plate to the rack. The support plate is operable for attachment to a floor on which the electrical equipment rack is positioned.

BRIEF DESCRIPTION OF THE DRAWINGS

Embodiments of the present invention will now be described, by way of example only, with reference to the following drawings in which.

DETAILED DESCRIPTION

Typically, server racks are designed to be moveable by means of casters arranged adjacent each corner of the rack base. Typically, a support leg is also provided adjacent each corner. The support legs are retractable into the rack volume and are raised to a retracted position when the rack is moved on its casters, but are lowered once the rack is in a desired location so that the rack is supported on the legs and the casters are raised above the floor or otherwise immobilized by a locking mechanism. The rack may be further secured using a support plate securely fixed to both the rack and the floor. When the rack is not secured in this way, addition by an operator of a server to a vacant position in the rack may cause the rack to move, or become unstable.

Figure 1:
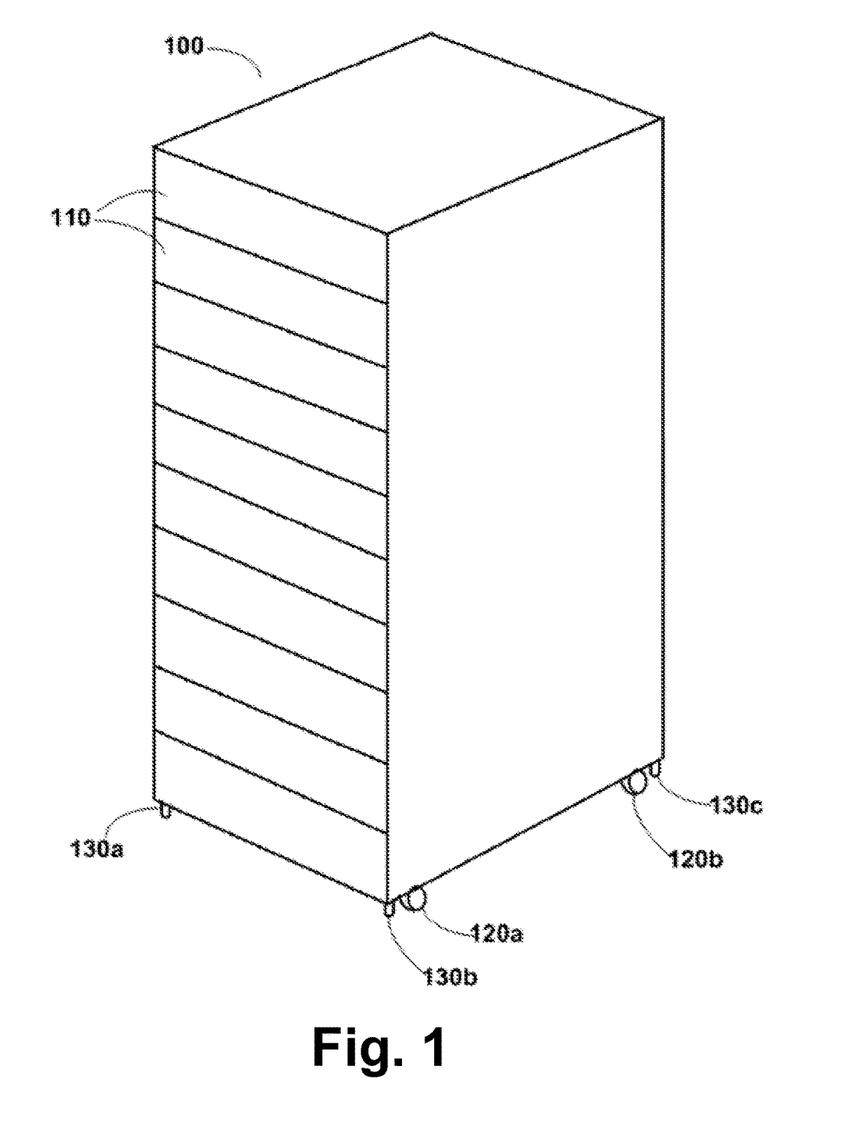
FIG. 1 illustrates an electrical equipment rack according to a prior art.

Datacenter rack 100 is illustrated in FIG. 1. The following will be described with reference to computer servers, but it will be apparent that such racks may also be employed with any other electrical equipment units, for example data handling units such as data storage units or data communications units. Rack 100 comprises a frame containing a number of servers 110 mounted in the rack. Rack 100 comprises casters 120a, 120b attached to the underside of the base member of frame of rack 100, typically one caster being adjacent each corner of the base member of the frame of rack 100. Rack 100 is moveable over the floor of the datacenter in which it is to be installed by means of casters, such as casters 120a, 120b. In addition, rack 100 comprises supports for supporting the rack on the floor, for example support legs 130a, 130b, 130c, typically one support leg being adjacent each corner of the base member of the frame of rack 100. The support legs are in a raised position when the rack 100 is moved on its casters, and are lowered so that the rack is supported on them when the rack 100 is installed in an operational site within the datacenter.

Figure 2:
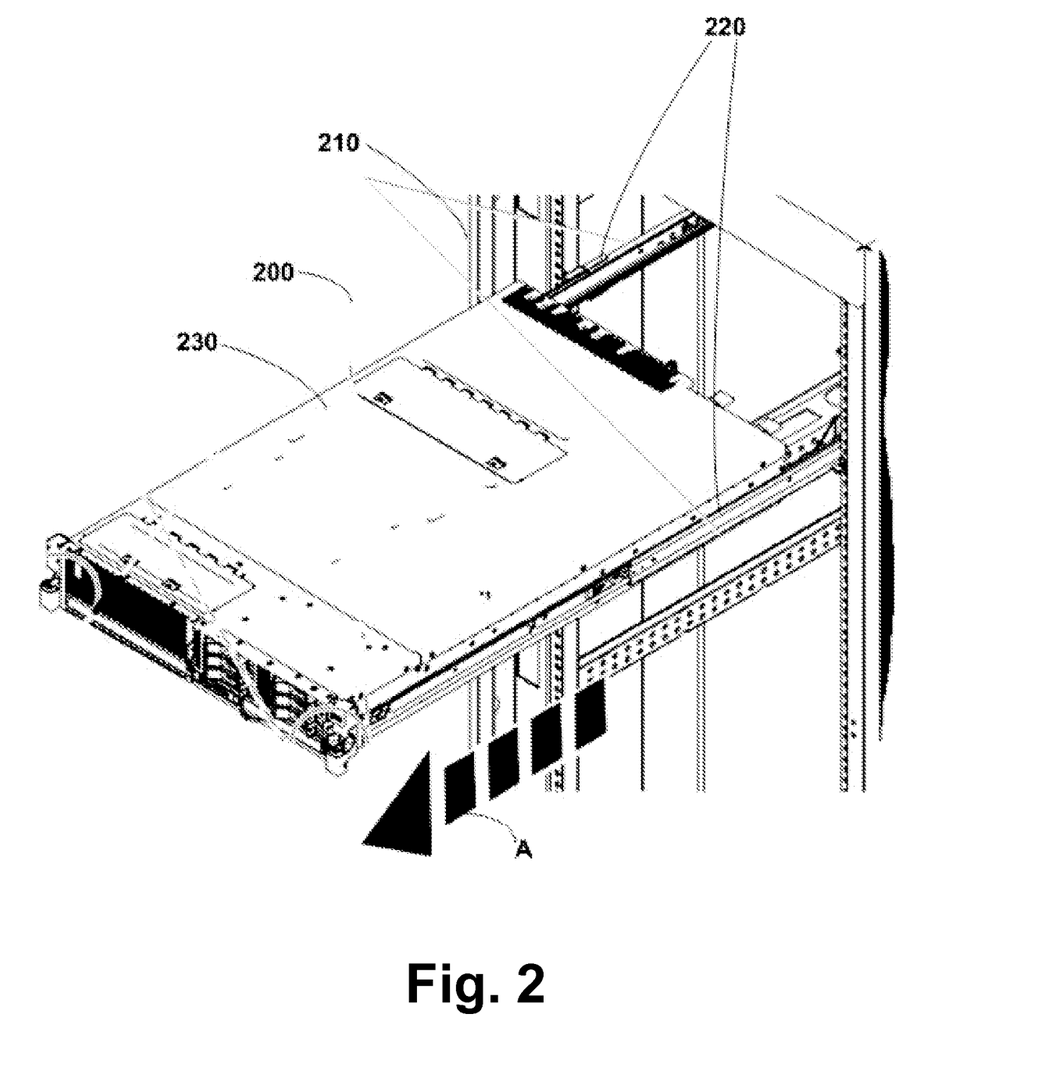
FIG. 2 illustrates operation of an electrical equipment unit rack drawer according to the prior art.

FIG. 2 illustrates server-rack mounting arrangement 200. Rack frame 210 comprises mounting points for extendable electrical equipment unit mounting rails, such as server mounting rails 220 on to which are mounted server 230. Server 230 may be moved between an operational position within rack frame 210 and a position external to the rack frame 210, as illustrated by arrow A shown in FIG. 2, by means of the extendable server mounting rails 220. At the external position, server 230 may be removed by lifting from extendable server mounting rails 220.

Figure 3:
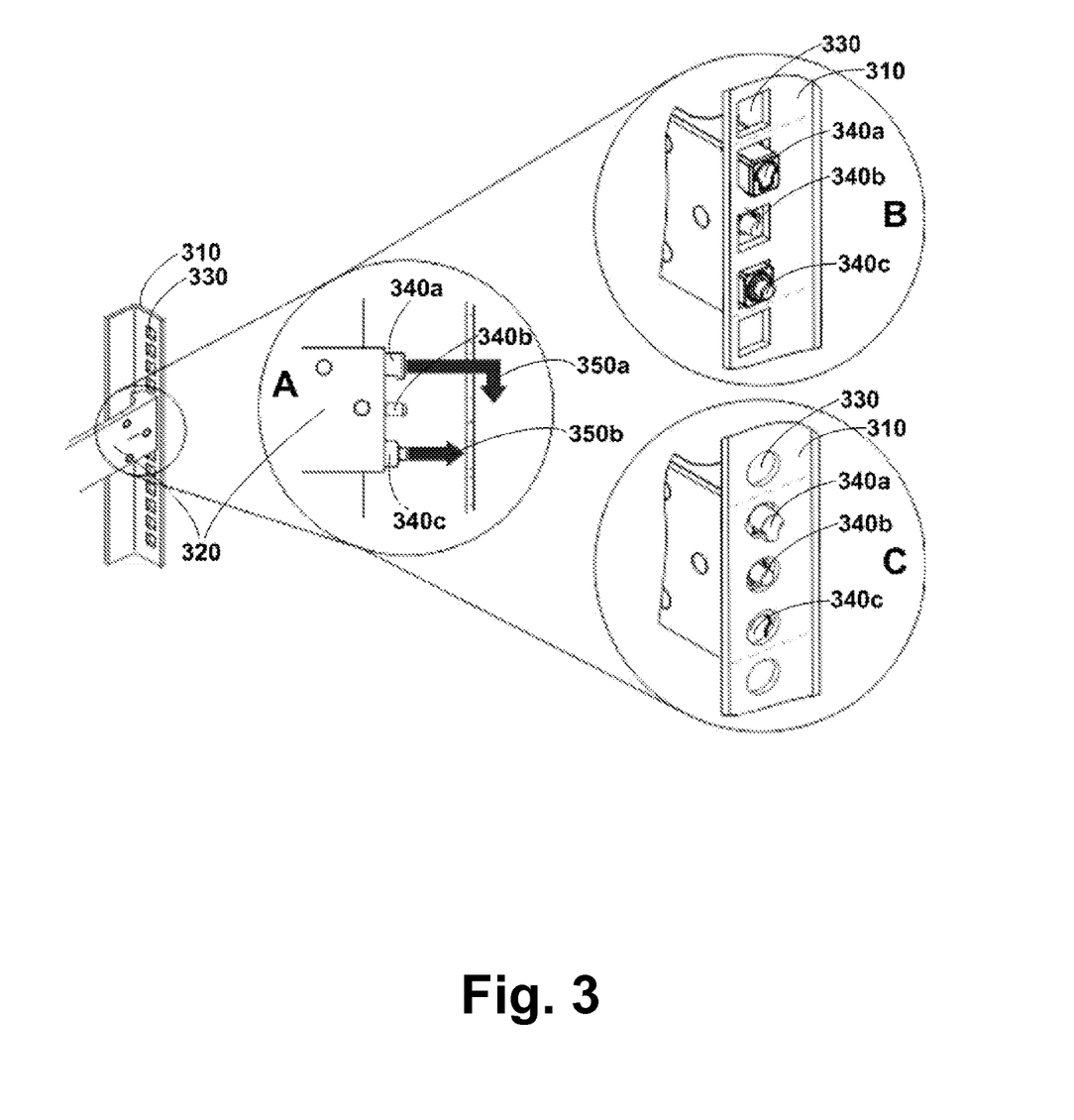
FIG. 3 illustrates mounting of an extendable mounting rail to a rack according to the prior art.

FIG. 3 illustrates an arrangement for mounting extendable mounting rail 220 to rack frame 210. Vertical frame element 310 comprises in its simplest form an L-shaped metal form at a corner of rack frame 210. Vertical frame element 310 comprises a vertical row of substantially equally spaced rack mounting points comprising apertures 330. Mounting points 330 are located on front and rear facing portions of vertical frame elements, for example vertical frame element 310, of rack frame 210.

Frame mountable portion 320 of extendable mounting rail 220 mounts to vertical frame element 310 as illustrated in circle A of FIG. 3. Frame mountable portion 320 comprises frame engaging pegs 340a, 340b and 340c. As illustrated, peg 340a comprises a hook-like cross-sectional shape which allows peg 340a to engage securely in a corresponding mounting point 330. To mount mountable portion 320 of extendable mounting rail 220, pegs 340a, 340b and 340c are aligned with respective apertures 330 and are then moved in direction of arrow 350b. The mounting rail 220 are secured further by moving downwards as shown by arrow 350a. A similar operation is performed at the opposite end of mounting rail 220 so as to secure mounting rail 220 to front and rear vertical frame elements 310.

Mounting points comprising apertures 330 may be rectangular in shape as illustrated in circle B of FIG. 3. Alternatively, they may be of any suitable shape, for example, circular as illustrated in circle C of FIG. 3. A mounting rail 220 securing mechanism may comprise additional structures, for example locking latches (not shown), to further secure mounting rail 220 to vertical frame elements 310. A person skilled in the art will understand that many other variants upon the structure described above are known.

Figure 4A:
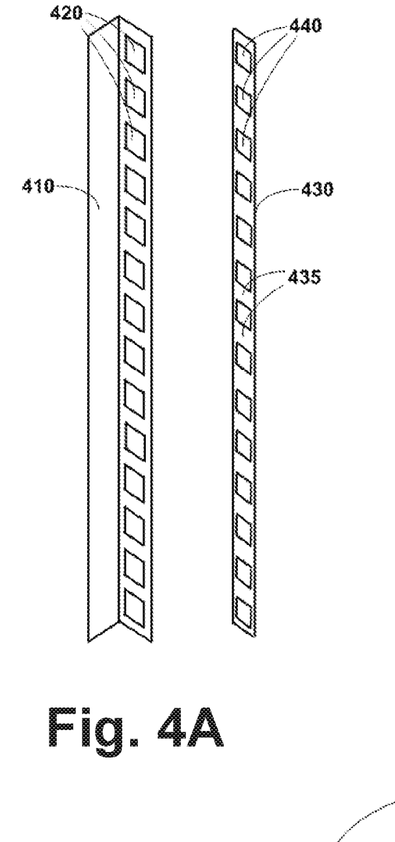
FIGS. 4A to 4C illustrate mounting of a strip member to a rack vertical frame element according to an embodiment of the invention.
Figure 4B:
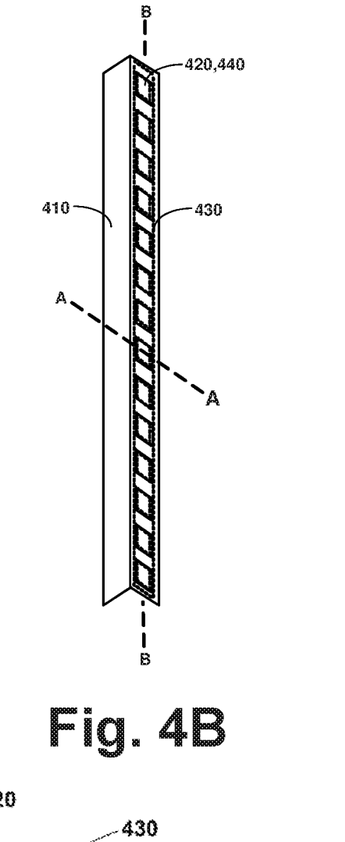
Figure 4C:
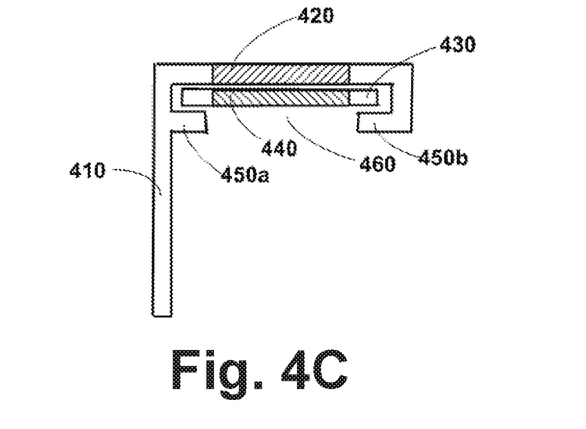

FIGS. 4A to 4C illustrate an apparatus according to an embodiment of the present invention. Rack vertical frame element 410 illustrated in FIG. 4A is comparable to vertical frame element 310 as described above with reference to the prior art. The embodiment will be described with reference to vertical frame element 410 which is the front right frame element of a rack when viewed from the front of the rack. It will be apparent that this is for convenience of illustration and embodiments of the present invention may also be applied to any other rack vertical frame element in one of the other corners of the rack. Vertical frame element 410 comprises rack mounting points comprising apertures 420, comparable to apertures 330 as described above with reference to the prior art, and spaced apart vertically at regular intervals as in the prior art.

The embodiment further comprises vertical strip member 430 as illustrated in FIG. 4A. Strip member 430 is a vertically elongated sheet member comprising apertures 440 vertically spaced at the same intervals as rack mounting points comprising apertures 420. Apertures 440 are preferably of similar size and shape to apertures 420. Cross pieces 435 occupy the spaces between apertures 440, and above the uppermost and below the lowermost aperture. Vertical strip member 430 is positioned adjacent the front facing portion of vertical frame element 410 as shown in dashed outline in FIG. 4B. Strip member 430 is secured to vertical frame element 410 so as to be operable for vertical movement relative to vertical frame element 410 in such a way as to allow apertures 440 to be superimposed over apertures 420 as illustrated in FIG. 4B.

FIG. 4C is a cross sectional view along dashed line A-A in FIG. 4B. It illustrates an embodiment comprising a secure mounting of strip member 430 to vertical frame element 410 which allows vertical movement of strip member 430 relative to vertical frame element 410. Vertical frame element 410 comprises vertically extended protruding elements 450a and 450b which are present over at least a substantial portion of the vertical height of strip member 430 in its operable position. Protruding elements 450a and 450b define a channel 460 within which strip member 430 is retained securely in such a way as to allow vertical movement of strip member 430 relative to vertical frame element 410. It will be apparent to a person skilled in the art that other mechanisms of secure mounting of strip member 430 whilst allowing vertical movement of strip member 430 relative to vertical frame element 410 are possible without departing from the scope of the invention.

Some embodiments of the present invention thereby provide a mechanism which allows insertion of engaging pegs, for example hook-shaped upper peg 340a of frame mountable portion 320 of electrical equipment unit mounting rail such as server extendable mounting rail 220, into apertures 420, 440 when apertures 420, 440 are superimposed. When not superimposed, the effective opening provided from overlapping of apertures 420, 440 is restricted in size so that when the effective opening size is reduced beyond a certain point, peg 340a may no longer be inserted, thereby preventing mounting of frame mountable portion 320 of extendable mounting rail 220 to vertical frame element 410.

Strip member 430 may be made of any suitable substantially rigid material. Strip member 430 may comprise a metal member having material similar to vertical frame element 410, or it may be made of a plastic, composite, or laminated material, for example. Although for convenience of illustration strip member 430 is shown as being of similar thickness to vertical frame element 410, it may be any suitable thickness, and may be much thinner in cross section than vertical frame element 410. Although shown positioned on the rack inner side of vertical frame element 410, in other embodiments strip member 430 may be positioned on the outside of the rack vertical frame element 410. It will be apparent that other arrangements are possible without departing from the scope of the invention.

Figure 5A:
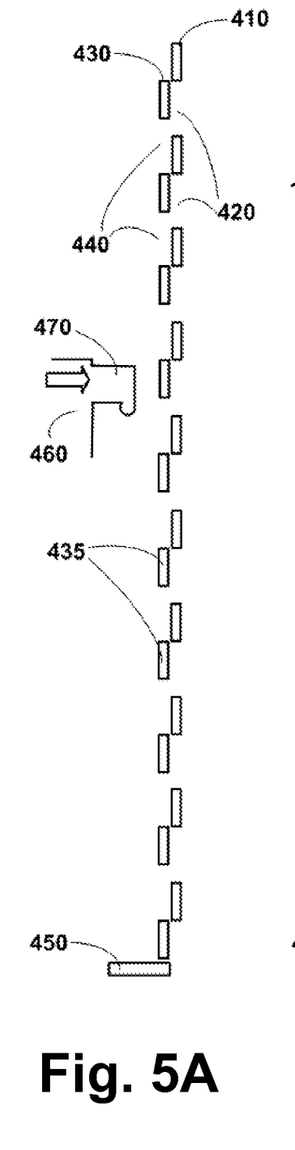
FIGS. 5A to 5C illustrate mounting of an extendable mounting rail to a rack according to an embodiment of the invention.
Figure 5B:
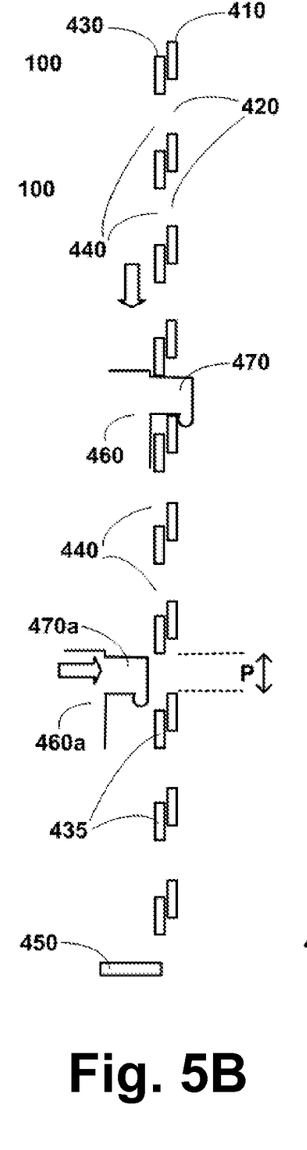
Figure 5C:
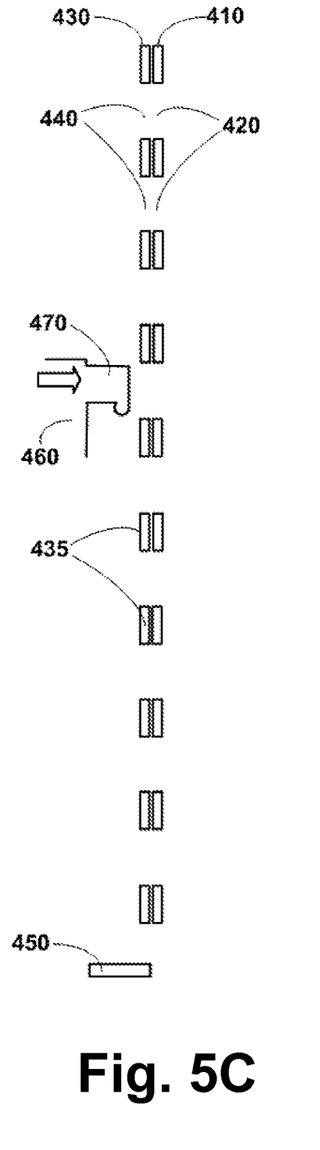

FIGS. 5A to 5C illustrate a method of operation according to an embodiment of the present invention and show a vertical cross-section along line B-B of FIG. 4B. In some embodiments of the present invention, strip member 430 is biased for movement downwards when it is not acted upon by an external force to raise it vertically. This biasing may be, for example, by the action of gravity, i.e. by the weight of strip member 430 itself, or by weight provided by a raising means attached to strip member 430 as described below with reference to FIGS. 6A and 6B.

In an embodiment of the present invention, vertical movement of strip member 430 is enabled between a fully raised position and a fully lowered position. In the fully raised position, the positions of apertures 440 in strip member 430 coincide with the positions of apertures 420 in vertical frame element 410, i.e. they are superimposed, as illustrated in FIG. 5C. In the fully lowered position illustrated in FIG. 5A, further downward movement is prevented by movement limiting means 450, which may comprise a physical stop as illustrated in FIG. 5A. In the fully lowered position, the positions of apertures 440 in strip member 430 do not coincide with the positions of apertures 420, i.e. apertures 420 are largely or completely occluded by the cross piece 435 material of strip member 430 which is between apertures 440 of strip member 430.

FIG. 5A, which illustrates strip member 430 in a fully lowered position, represents a rack in which no rack mounting points are occupied (at least on that side of the rack) and therefore no servers are loaded in the rack. Illustrated in FIG. 5A is frame mountable portion 460 of an extendable electrical equipment unit mounting rail such as server mounting rail comprising upper peg 470. Hook-shaped upper peg 470 cannot be inserted into an aperture 420 of vertical frame element 410 in the direction of the arrow because the aperture is occluded by cross piece 435 material of strip member 430. Therefore server mounting rails may not be added to the rack whilst strip member 430 is in this position and so servers may not be loaded into the rack.

FIG. 5C illustrates strip member 430 in a fully raised position. Apertures 440 in strip member 430 coincide with apertures 420 in rack vertical frame element 410. Peg 470 of frame mountable portion 460 of an extendable server mounting rail may be fully inserted in an aperture 420, 440 as illustrated by the arrow. Server mounting rails may therefore be added to the rack whilst strip member 430 is in this position and so servers may be loaded in to the rack.

FIG. 5B illustrates strip member 430 in an intermediate partially lowered position in which downward movement of strip member 430 is arrested by contact of cross piece 435 with peg 470 of frame mountable portion 460 of an extendable server mounting rail. Peg 470 of frame mountable portion 460 has been previously inserted into aperture 420, 440 whilst strip member 430 was in a fully raised position as illustrated in FIG. 5C. This intermediate partially lowered position therefore corresponds to a situation in which a rack comprises at least one frame mountable portion of an extendable server mounting rail in a mounted position, and so to an at least partially populated rack.

In the intermediate position of FIG. 5B, apertures 420 of vertical frame element 410 are only partially occluded by strip member 430. However, it will be apparent that the effective orifice height (the opening size) as indicated by the letter P in FIG. 5B is not sufficient to allow passage of peg 470a of frame mountable portion 460a of an extendable server mounting rail when moved in the direction of the arrow because of the hook shape of peg 470a. Therefore server mounting rails may not be added to the rack whilst strip member 430 is in this position and so servers may not be loaded into the rack. This intermediate position also obstructs and so hinders removal of frame mountable portions 460 of extendable server mounting rails already loaded in the rack.

Figure 6A:
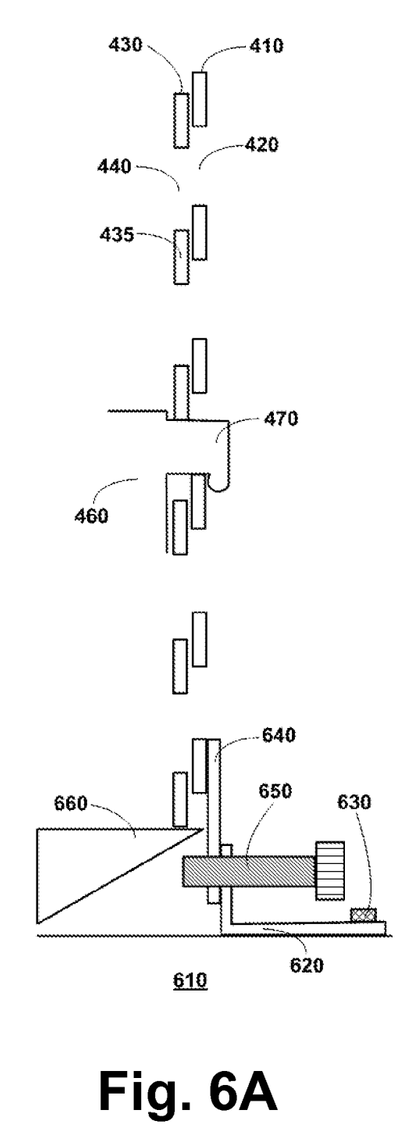
FIGS. 6A and 6B illustrate the operation of a strip member raising means according to an embodiment of the invention.
Figure 6B:
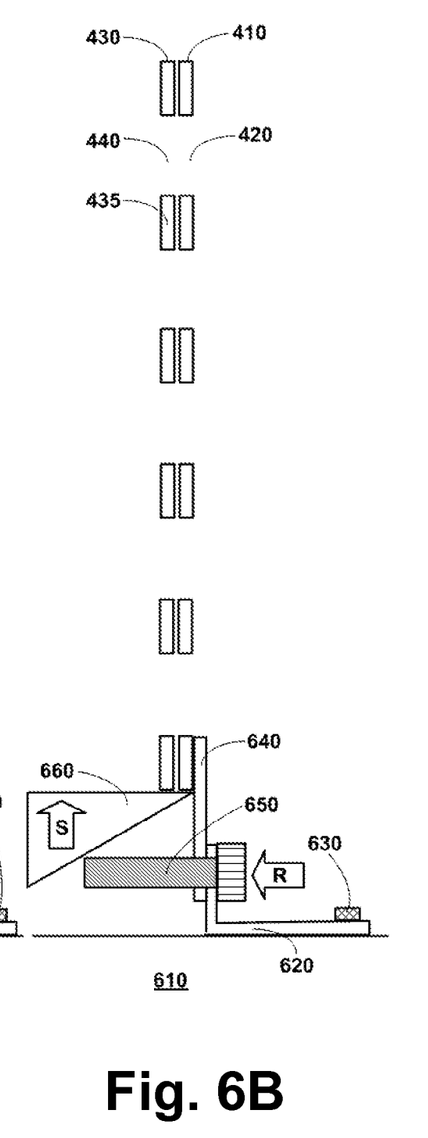

FIGS. 6A and 6B illustrate the lower portion of a rack comprising rack vertical frame element 410 and strip member 430 according to an embodiment of the present invention. In some embodiments of the present invention, the rack may be moved to a desired location for server installation, for example by moving it on integral casters over floor 610. If the rack comprises support legs, the support legs may be lowered to support the rack. The rack is further secured by means of support plate 620. Support plate 620 is substantially similar to conventional known support plates used to secure racks to floors. In some embodiments of the present invention, support plate 620 comprises a member with a substantially L-shaped cross-section and may be of length so as to extend over a substantial portion of the width of the lower front of the rack. Support plate 620 may be made of any suitable rigid material, for example a metallic material similar to the metallic material of the rack. Fastener 630 attaches the horizontal portion of support plate 620 to floor 610. Fastener 630 may be a bolt driven into a suitable receiving screw aperture in floor 610. Two or more fasteners 630 may be used at two or more fastening positions along the horizontal portion of support plate 620.

A vertical portion of support plate 620 abuts a rack frame element 640 at the lower front part of the rack. Although illustrated as a separate element for convenience of illustration, rack frame element 640 may comprise an integral part of the rack, and may comprise, for example, a horizontal element integral with rack vertical frame element 410. In an embodiment, fastener 650 securely attaches support plate 620 to rack frame element 640 as shown in FIG. 6B.

FIGS. 6A and 6B further illustrate a fastening operation. The rack may be partially populated, for example with frame mountable portion 460 of a server mounting rail comprising peg 470 as shown in FIG. 6A. In an embodiment, fastener 650 comprises a bolt fastener. In the embodiment a screw aperture in the vertical portion of support plate 620 and suitable for fastener 650 aligns with a similar screw aperture in abutted rack frame element 640. In FIG. 6A bolt fastener 650 is driven through the aligned respective screw holes. Strip member 430 comprises linked raising means at its lower end. In an embodiment, raising means comprises wedge-shaped raising means 660 attached to lower end of strip member 430. The bolt fastener 650 is driven through aligned screw holes in support plate 620 and rack frame element 640 until the opposite end abuts the sloping edge of wedge-shaped raising means 660.

The bolt fastener 650 is driven further, and the opposite end moves along the sloping edge of wedge-shaped raising means 660 which causes raising means 650 to rise vertically as its movement is constrained by linkage to strip member 430 that rises accordingly. Arrow R in FIG. 6B illustrates the fastener 650 driving direction and arrow S illustrates the resulting movement of wedge-shaped raising means 660 and strip member 430. In FIG. 6B, bolt fastener 650 is fully inserted, for example until the fastener head abuts the vertical portion of support plate 620. Strip member 430 is now in its fully raised position. Mounting position apertures 420 in rack vertical frame element 410 coincide with apertures 440 in strip member 430. Server mounting rails may be added to the rack whilst strip member 430 is in this position and so servers may be loaded in to the rack.

The described embodiments provide a mechanism which links the means of attachment of a support plate to the rack with the raising of strip member 430 to a fully raised position at which mounting points are no longer obstructed, and frame mountable portions of server mounting rails may be added to, or removed from, the rack. In this way, some embodiments of the present invention help to ensure that users add servers to the rack and remove them from the rack only once the rack is secured to floor 610. The embodiments of the present invention thereby provide enhanced safety.

It will be apparent to the skilled person that many variations may be envisaged without departing from the scope of the invention. In some embodiments, raising means 660 is vertically below strip member 430. In other embodiments, raising means 660 is placed more centrally along the front of the rack and linked by suitable linkage means to strip member 430. It will be apparent to the skilled person that other arrangements are possible without departing from the scope of the invention.

Figure 7A:
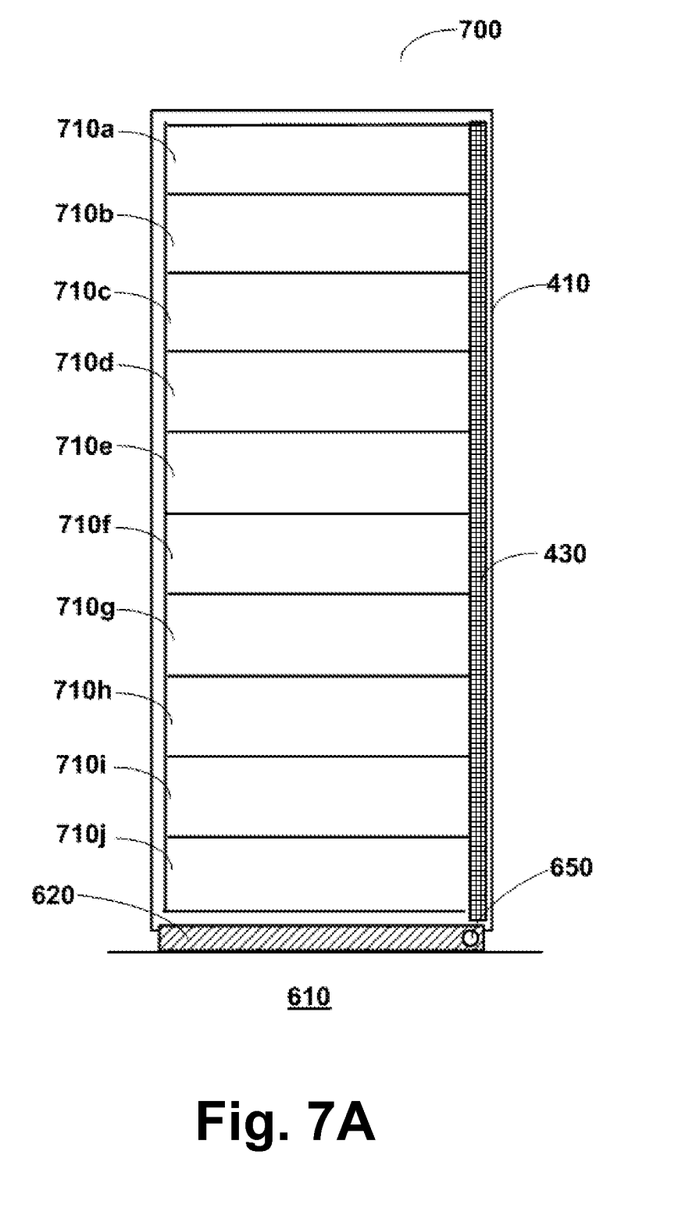
FIG. 7A illustrates a front view of a rack comprising an embodiment of the present invention.

FIG. 7A illustrates a front view of a rack 700 according to a first embodiment of the present invention. Rack 700 comprises loading positions for servers illustrated as 710a to 710j. It will be apparent that a larger or smaller number of positions may be provided without departing from the scope of the invention. Strip member 430 is slidably mounted adjacent the front facing part of rack vertical frame element 410, as described above with reference to previous figures. Support plate 620 is attached to floor 610 by fasteners 630 (not shown) through its horizontal portion. Support plate 620 vertical portion is attached to rack 700 by means of fastener 650 whose insertion is linked to raising of strip member 430 as described above with reference to previous figures. Support plate 620 may extend across most of the front of rack 700 as illustrated in FIG. 7A. Other fasteners not linked to strip member 430 raising means 660 may be used to secure support plate 620 to rack 700.

Figure 7B:
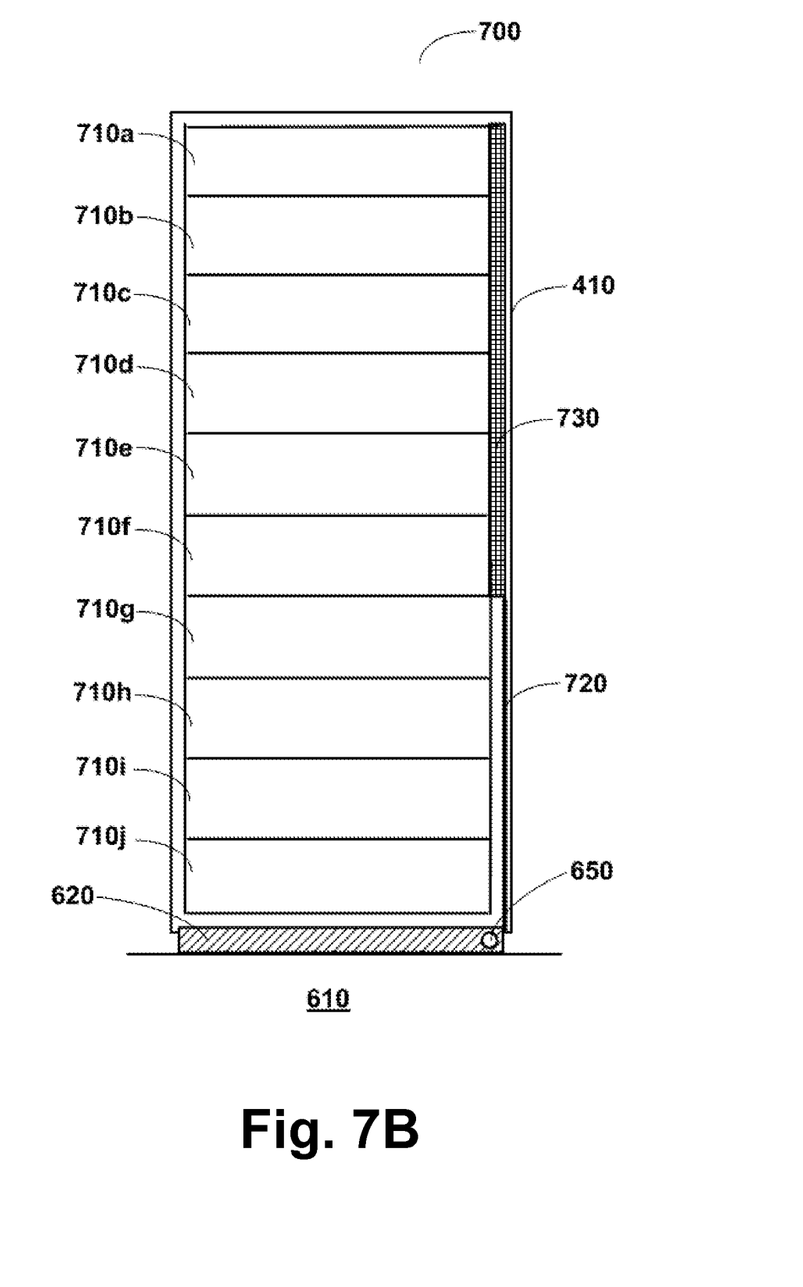
FIG. 7B illustrates a front view of a rack comprising an alternative embodiment of the present invention.

FIG. 7B illustrates a front view of a rack 700 according to a second embodiment of the present invention. In this embodiment, strip member 730 extends over only a part of the height of vertical frame element 410, and is otherwise substantially identical to strip member 430. It will be apparent that safety issues associated with adding servers to rack 700 are less likely to arise with the lower server mounting positions of rack 700 because the center of gravity of the rack is less affected by their movement in to or out of the rack. Strip member 730 covers the upper portion only of vertical frame element 410 so as to control adding of frame mountable portions of server mounting rails to only this portion of vertical frame element 410. In FIG. 7B this is illustrated as positions 710a to 710f but it will be apparent that any portion of vertical frame element 410 may be envisaged without departing from the scope of the invention. Strip member 730 is connected to raising means operated by insertion of fastener 640 by linkage 720 for transmitting vertical movement from the raising means to strip member 730. Linkage 720 may comprise a rigid rod or similar mechanism.

Figure 8:
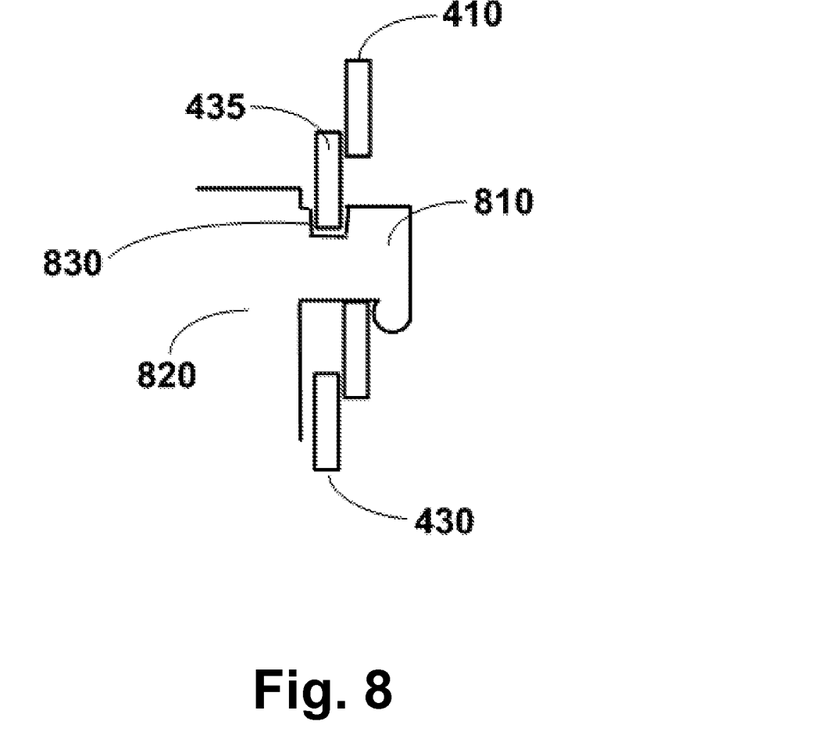
FIG. 8 illustrates mounting of an extendable mounting rail to a rack according to an alternative embodiment of the invention.

FIG. 8 illustrates an apparatus according to yet another embodiment of the present invention. In this embodiment, upper peg 810 of frame mountable portion of server mounting rail 820 is modified with a notch 830 in its upper surface. In this embodiment, after frame mountable portion of server mounting rail 820 has been mounted in the rack as described with reference to previously described embodiments, cross piece 435 of strip member 430 lowers into notch 830. An additional impediment to removal of frame mountable portion of server mounting rail 820 is thereby provided. Furthermore, opening size P as illustrated in FIG. 5B is thereby further reduced in size and so provides an additional impediment to adding further server mounting rails.

It will be apparent to the skilled person that variations of the above are possible without departing from the scope of the invention. Embodiments of the invention have been described with reference to the front right rack vertical frame element 410. It will be apparent that embodiments of the invention may be applied to other vertical frame elements, for example the front left vertical frame element, without departing from the scope of the invention. This may be in addition to or in place of application to the front right vertical frame element.

The skilled person will also understand that other arrangements of support plate 620 may be envisaged without departing from the scope of the invention. Support plate 620 may comprise a shape different from that described above. It may also extend over a smaller or larger portion of the front of the rack 700. Furthermore, the skilled person will understand that many other arrangements of strip member raising means 660 may be envisaged without departing from the scope of the invention. A raising means incorporating a wedge-shaped means operated in a simple manner by a fastener 650 has been described, but many different arrangements are possible. Embodiments may comprise a more complex arrangement of linkages for linking insertion of the fastener with raising of the strip member.

What is claimed is:

1. A safety mechanism for an electrical equipment rack, wherein the electrical equipment rack comprises a frame including a vertical frame element having mounting points vertically spaced at mounting intervals thereon and wherein the mounting points include mounting apertures for accepting mounting pegs of a frame mountable portion of an electrical equipment unit mounting rail, the safety mechanism comprising:
    a vertical strip member mounted for vertical movement adjacent the vertical frame element, wherein the vertical strip member includes strip apertures spaced at intervals corresponding to the mounting intervals, and the vertical strip member is operable for moving between a fully raised position, in which the strip apertures are aligned with mounting apertures so as to allow acceptance or removal of the mounting pegs of the mounting rail into the mounting apertures, and a lowered position, in which the mounting apertures of the vertical frame element are offset relative to the strip apertures to obstruct the acceptance or removal of the mounting pegs into the mounting apertures and wherein the vertical strip member is biased for downwards movement when the vertical strip member is not acted upon by an external force to raise the vertical strip member;
    a support plate disposed between the electrical equipment rack and a floor; and
    a raising mechanism for raising the vertical strip member from the lowered position to the fully raised position by insertion of a fastener, wherein upon insertion the fastener attaches the support plate to the electrical equipment rack, and the support plate is operable for attachment to the floor on which the electrical equipment rack is positioned.

2. The safety mechanism of claim 1, wherein the fastener interacts mechanically with the raising mechanism to raise the vertical strip member when the fastener is inserted into the electrical equipment rack.

3. The safety mechanism of claim 2, wherein the raising mechanism comprises a wedge-shaped member linked to the vertical strip member, the wedge-shaped member being acted upon by abutment of the inserted fastener against a sloping edge of the wedge-shaped member, so that movement of the fastener towards the wedge-shaped member causes the wedge-shaped member to rise vertically, and thereby raises the linked vertical strip member.

4. The safety mechanism of claim 1, wherein full insertion of the fastener, so that the electrical equipment rack is securely fixed to the support plate, corresponds to the fully raised position of the vertical strip member.

5. The safety mechanism of claim 1, wherein, if the fastener does not act upon the raising mechanism, the lowered position is a fully lowered position when no mounting points are occupied, or a partially lowered position when at least one mounting point is occupied by a mounting peg so that cross piece material of the vertical strip member engages the mounting peg.

6. The safety mechanism of claim 5, wherein the engaging of the mounting peg is by the cross piece material of the vertical strip member resting on top of the mounting peg.

7. The safety mechanism of claim 5, wherein the engaging of the mounting peg is by the cross piece material of the vertical strip member resting in a notch in a top surface of the mounting peg.

8. The safety mechanism of claim 1, wherein the vertical strip member extends over all of the mounting points comprising apertures of the vertical frame element.

9. The safety mechanism of claim 1, wherein the vertical strip member extends over an upper portion of the mounting points comprising apertures of the vertical frame element.

10. An electrical equipment rack, the electrical equipment rack comprising:
   a frame including a vertical frame element having vertically spaced at intervals thereon mounting points wherein the mounting points include mounting apertures for accepting mounting pegs of a frame mountable portion of an electrical equipment unit mounting rail; and
   a safety mechanism, wherein the safety mechanism includes a vertical strip member mounted for vertical movement adjacent the vertical frame element wherein the vertical strip member includes strip apertures spaced at intervals corresponding to the intervals at which the vertically spaced mounting points are spaced on the vertical frame element, and the vertical strip member is operable for moving between a fully raised position, in which the strip apertures of the strip member are aligned with mounting apertures of the mounting points on the vertical frame element so as to allow acceptance or removal of the mounting pegs of the mounting rail, and a lowered position, in which the mounting apertures of the vertical frame element are offset relative to the strip apertures of the vertical strip member to obstruct the acceptance or removal of the mounting pegs and wherein the vertical strip member is biased for downwards movement when the vertical strip member is not acted upon by an external force to raise the vertical strip member;
   a support plate disposed between the electrical equipment rack and a floor; and
   a raising mechanism for raising the vertical strip member from the lowered position to the fully raised position by insertion of a fastener, wherein upon insertion the fastener attaches the support plate to the electrical equipment rack, and the support plate is operable for attachment to the floor on which the electrical equipment rack is positioned.

11. The electrical equipment rack of claim 10, wherein the fastener interacts mechanically with the raising mechanism so as to raise the vertical strip member when the fastener is inserted into the electrical equipment rack.

12. The electrical equipment rack of claim 11, wherein the raising mechanism comprises a wedge-shaped member linked to the vertical strip member, the wedge-shaped member being acted upon by abutment of the inserted fastener against a sloping edge of the wedge-shaped member, so that movement of the fastener towards the wedge-shaped member causes the wedge-shaped member to rise vertically, and thereby raises the linked vertical strip member.

13. The electrical equipment rack of claim 10, wherein full insertion of the fastener, so that the electrical equipment rack is securely fixed to the support plate, corresponds to the fully raised position of the vertical strip member.

14. The electrical equipment rack of claim 10, wherein, if the fastener does not act upon the raising mechanism, the lowered position is a fully lowered position when no mounting points are occupied, or a partially lowered position when at least one mounting point is occupied by a mounting peg so that cross piece material of the vertical strip member engages the mounting peg.

15. The electrical equipment rack of claim 14, wherein the engaging of the mounting peg is by the cross piece material of the vertical strip member resting on top of the mounting peg.

16. The electrical equipment rack of claim 14, wherein the engaging of the mounting peg is by the cross piece material of the vertical strip member resting in a notch in a top surface of the mounting peg.

17. The electrical equipment rack of claim 10, wherein the vertical strip member extends over all of the mounting points comprising apertures of the vertical frame element.

18. The electrical equipment rack of claim 10, wherein the vertical strip member extends over an upper portion of the mounting points comprising apertures of the vertical frame element.

* * * * *